(12) United States Patent
Liu (10) Patent No.: US 6,815,638 B2
(45) Date of Patent: Nov. 9, 2004

(54) METHOD OF DETERMINING A MINIMUM PULSE WIDTH FOR A SHORT PULSE LASER SYSTEM

(75) Inventor: Xinbing Liu, Acton, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 211 days.

(21) Appl. No.: 10/267,034

(22) Filed: Oct. 8, 2002

(65) Prior Publication Data
US 2004/0017560 A1 Jan. 29, 2004

Related U.S. Application Data

(60) Provisional application No. 60/398,486, filed on Jul. 25, 2002.

(51) Int. Cl.[7] ............................................. B23K 26/067
(52) U.S. Cl. .................................................. 219/121.71
(58) Field of Search ................................. 359/563, 566, 359/569; 700/166; 219/121.67, 121.68, 121.69, 121.7, 121.71, 121.72, 121.73, 121.76, 121.78, 121.79, 121.83, 121.85

(56) References Cited

U.S. PATENT DOCUMENTS

| | | | | |
|---|---|---|---|---|
| 4,427,874 A | * | 1/1984 | Tabata et al. | 219/130.51 |
| 5,656,186 A | * | 8/1997 | Mourou et al. | 219/121.69 |
| 5,780,806 A | * | 7/1998 | Ferguson et al. | 219/121.68 |
| 6,347,171 B1 | * | 2/2002 | Tatah et al. | 385/37 |
| 6,433,303 B1 | * | 8/2002 | Liu et al. | 219/121.7 |
| 6,710,293 B2 | * | 3/2004 | Liu et al. | 219/121.73 |
| 6,720,519 B2 | * | 4/2004 | Liu et al. | 219/121.61 |

* cited by examiner

Primary Examiner—Kiley Stoner
Assistant Examiner—Jonathan Johnson
(74) Attorney, Agent, or Firm—Harness, Dickey & Pierce, PLC (57) ABSTRACT

A method is provided for determining a minimum pulse width for a pulsed laser beam in a short pulse laser system, such that the minimum pulse width accounts for dispersion associated with the pulse laser beam passing through a diffractive optical element. The method includes: determining size data for an ablation to be formed in a surface of a workpiece; determining an operating wavelength for a pulsed laser beam; determining spot size data for the beam incident on the workpiece; determining tolerance data for the spot size of the incident beam; and determining a minimum pulse width for the pulsed laser beam based on the size data for the ablation, the operating wavelength for the laser beam, the spot size data for the laser beam and the tolerance data for the spot size.

14 Claims, 5 Drawing Sheets

METHOD OF DETERMINING A MINIMUM PULSE WIDTH FOR A SHORT PULSE LASER SYSTEM

CROSS-REFERENCE TO RELATED APPLICATIONS

This application claims the benefit of U.S. Provisional Application Ser. No. 60/398,486 which was filed on Jul. 25, 2002 and is incorporated by reference herein.

FIELD OF THE INVENTION

The present invention relates to short pulse laser system, and more particularly, to a method for determining a minimum pulse width for a pulsed laser beam in a short pulse laser system.

BACKGROUND OF THE INVENTION

Ultrafast lasers generate intense laser pulses with durations from roughly 10–11 seconds (10 picoseconds) to 10–14 seconds (10 femtoseconds). A wide variety of potential applications for ultrafast lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in hard materials, such as cooling channels in turbine blades, nozzles in ink-jet printers, or via holes in printed circuit boards.

Laser drilling of holes in a particular pattern using optical parallel processing has been used for a variety of fast and ultrafast laser applications, and is generally applied using projection imaging of a mask containing the pattern (usually at a magnification), or a beamsplitter, such as a diffractive optical element (diffractive optical element). Optical parallel processing is desirable in order to enable mass production techniques to increase throughput and quickly create customer-specified geometries in final products. These geometries often require multiple small holes to be drilled in a particular pattern that must be accurate, consistent, and repeatable from workpiece (the material the laser is drilling) to workpiece.

Parallel processing using a beam splitter usually has the advantage over mask projection imaging that it has high light utilization efficiency, hence higher drilling speed. However, there are special challenges to using a diffractive optical element in ultrashort laser processing applications. Ultrashort laser pulses have much larger spectral bandwidth compared long pulses, i.e., they contain many wavelength components, and the diffractive optical element is spectrally dispersive, i.e. different wavelengths are diffracted in different directions. It is necessary to understand the behavior and limitations of using a diffractive optical element in ultrashort laser processing in order to select the correct laser for the parallel processing system.

Consequently, in a market that measures its annual revenue in millions of dollars, the company that develops new methods of making laser micromachining tools more accurate and efficient will help to optimize performance and minimize production cost in a wide variety of applications within the laser micromachining industry.

SUMMARY OF THE INVENTION

In accordance with the present invention, a method is provided for determining a minimum pulse width for a pulsed laser beam in a short pulse laser system, such that the minimum pulse width accounts for dispersion associated with the pulse laser beam passing through a diffractive optical element. The method includes: determining size data for an ablation to be formed in a surface of a workpiece; determining an operating wavelength for a pulsed laser beam; determining spot size data for the beam incident on the workpiece; determining tolerance data for the spot size of the incident beam; and determining a minimum pulse width for the pulsed laser beam based on the size data for the ablation, the operating wavelength for the laser beam, the spot size data for the laser beam and the tolerance data for the spot size.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

In general, the present invention is directed to a method of determining minimum pulse width for a short pulse laser system. This minimum pulse width can be used to control and/or to minimize spectral dispersion, thereby making short pulse laser drilling more efficient. While the following description is provided with reference to the particular application of using picosecond lasers to drill holes for laser inkjet nozzles, it is readily understood that the broader aspects of the present invention are generally applicable to short pulse laser applications.

Figure 1:
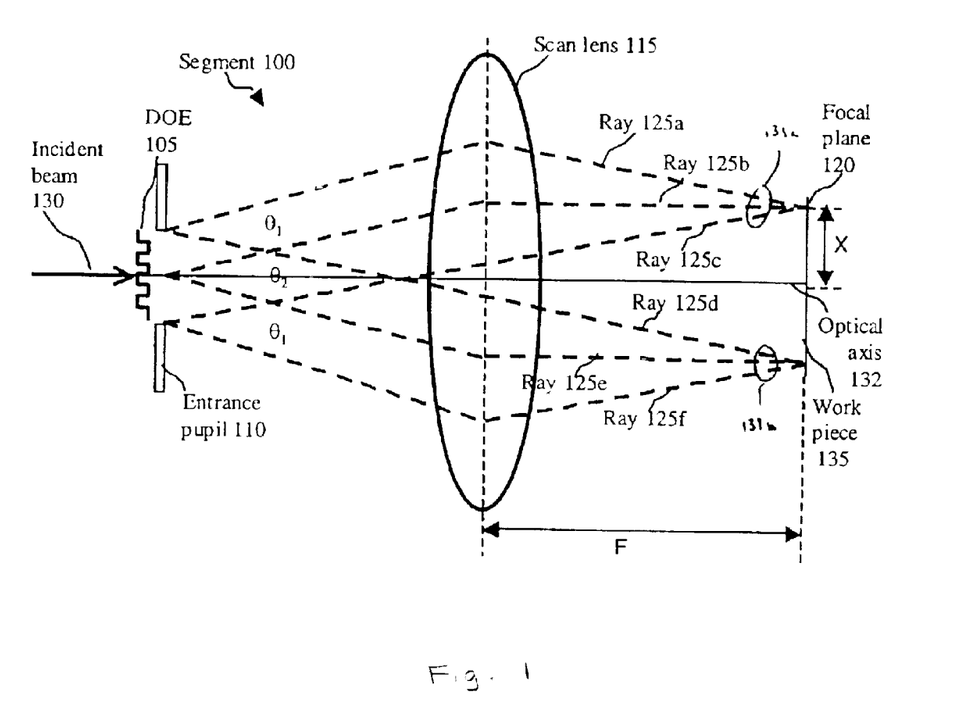
FIG. 1 is a diagram illustrating optical paths of multiple laser beams in an exemplary short pulse laser system.

FIG. 1 provides a partial view 100 of a short pulse laser system including the following elements: a diffractive optical element 105; an entrance pupil 110; a scan lens 115; a focal plane 120; several rays 125a–f, which form diffraction angles θ1 and θ2; an optical input 130; an optical axis 132; and a workpiece 135. Distance X and F are also indicated in FIG. 1.

Diffractive optical element 105 is preferably a beamsplitter that may be used in applications such as drilling multiple holes in inkjet nozzle workpiece materials. In the present application, a picosecond laser system, which is a relatively low energy laser, generates optical input 130 along optical axis 132, using conventional short pulse laser technology. Optical input 130 passes through diffractive optical element 105 and is split into a plurality of beams 125 at the point of entrance pupil 110. Diffraction angles θ1 and θ2, are the angles formed by ray 125a and ray 125d, ray 125b and ray 125e, and ray 125c and ray 125f, respectively, as they pass through scan lens 115.

Scan lens (also known as an f-theta lens) 115 may be a telecentric scan lens, which maintains the perpendicularity required of rays 125a through 125f with focal plane 120, and is conventionally known in laser technology. Scan lenses, and specifically telecentric lenses are commercially available from various vendors, including Rodenstock Precision Optics, and Special Optics. One example of such a scan lens from Special Optics has the following specification: wavelength 1.053 μm, focal length 100 mm, entrance pupil diameter 15 mm, and scan field 30 mm.

Focal plane 120 is the location where rays 125a through 125f are focused after passing through scan lens 115, and thus is the optimal location to position workpiece 135. F is the focal length of the scan lens, and is further discussed below. X is the distance between optical axis 132 and the point where the highest order beam meets focal plane 120, and is discussed further below.

In operation, optical input 130 is generated by a short pulse (picosecond) laser. Incident beam 130 is incident upon diffractive optical element 105 along optical axis 132, which is positioned in the entrance pupil 110 of scan lens 115, and is split into the pattern required according to the particular application; for instance, a pattern of beams might consist of 304 beams arranged in an 8×48 array. For simplicity of explanation, FIG. 1 has been limited to illustrate only two beams 131a and 131b. Each beam is defined by at least rays, including a central ray and two edge rays. For instance, beam 131a is defined by central ray 125b and two edge rays 125a and 125c. In the particular application of parallel process laser drilling, it is essential for the central ray of each beam to meet the workpiece 135 at a right angle in order to drill parallel holes and still maintain the pattern established by diffractive optical element 105. Telecentric scan lens 115 maintains the perpendicularity required of central rays 125b, 125e with focal plane 120, where beams 125a–f drill holes in workpiece 135 according to the pattern established by diffractive optical element 105.

Figure 2:
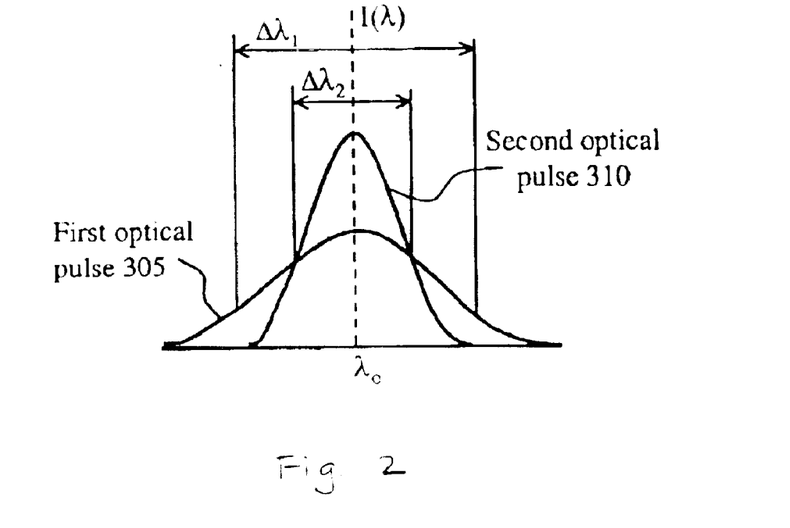
FIG. 2 is a diagram depicting exemplary laser beam intensity spectrum of two optical pulses.

FIG. 2 illustrates beam intensity I as a function of wavelength λ for a first optical pulse 305 and a second optical pulse 310. The central wavelength $\lambda_o$ is identical for the two pulses. Because of the mathematical relationship between time and bandwidth (specifically, $\Delta T \ast \Delta \lambda >= $ constant), a narrow bandwidth Δλ represents a wide pulse in time, and a wide bandwidth Δλ represents a narrow pulse in time. This relationship is well known in the art and can be shown via Fourier transform calculations. For a pulse that has Gaussian shape in time, the spectrum is also Gaussian in shape. In this case, the minimum product of pulse width and bandwidth is $$\Delta T \times \Delta \nu = 0.44, \quad (1)$$

or, if we use the relationship between frequency and wavelength of light, $$\lambda \cdot \nu = c, \quad (2)$$

we have $$\Delta T \times \Delta \lambda = 0.44 \times \lambda^2 / c, \quad (3)$$

where c is the speed of light. For example, for a laser operating at λ=1 μm and a pulse width of ΔT=0.1 ps=1×10⁻¹³ sec, the minimum bandwidth Δλ is $$\Delta \lambda_{min} = 0.44 \times \lambda^2 / (c \times \Delta T) \quad (4)$$

$$= 0.44 \times (1 \times 10^{-6})^2 / (3 \times 10^8 \times 1 \times 10^{-13})$$

$$= 1.5 \times 10^{-8} \text{ m} = 15 \text{ nm}.$$

On the other hand, if ΔT=10 ps=1×10⁻¹¹ sec, then the minimum bandwidth Δλ becomes $$\Delta \lambda_{min} = 0.44 \times \lambda^2 / (c \times \Delta T) \quad (5)$$

$$= 0.44 \times (1 \times 10^{-6})^2 / (3 \times 10^8 \times 1 \times 10^{-11})$$

$$= 1.5 \times 10^{-10} \text{ m} = 0.15 \text{ nm}.$$

A short time pulse is preferred because it minimizes excess thermal effects that lead to misshapen and distorted hole shapes; however, it can be seen from this time-bandwidth relationship that the shorter the duration of laser pulse, the larger the bandwidth and therefore the larger the spectral dispersion of a given pulse.

Figure 3:
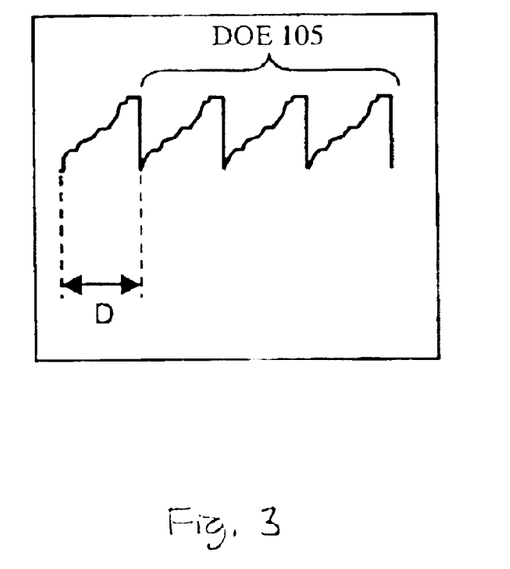
FIG. 3 is a diagram illustrating the periodic phase structure of a diffractive optical element.

FIG. 3 illustrates the periodic phase structure of diffractive optical element 105, with four periods shown. In FIG. 3, the horizontal axis as shown is distance and the vertical axis is phase (or height of surface relief structure) in an actual diffractive optical element. The period D determines the minimum diffraction angle, of which all diffraction angles (orders) are integer multiples. The particular phase structure within a period determines the properties of the diffractive optical element, such as the beam pattern, diffraction efficiency, and uniformity.

The periodic diffractive optical element is a diffractive grating, and thus obeys the laws for diffractive gratings. The diffracted angle for different orders by the diffractive optical element is given by the diffraction equation:

$$\theta \approx \sin \theta = m\lambda/D \quad (6)$$

where m is the diffraction order, λ the wavelength, and D the grating period. The diffraction equation says that the diffractive optical element is dispersive: the diffraction angle θ is a linear function of wavelength λ for the same diffraction order m.

Incident beam 130 is diffracted into multiple beams (different diffraction orders m) after diffractive optical element 105 according to equation (1). These beams are focused by the f-θ scan lens onto the lens's focal plane at different lateral positions x for different diffraction angles θ. The relation between x and q is given by $$x = f \times \theta, \quad (7)$$

Combining Equations (6) and (7), we have $$x = f \times \theta = f \cdot (m/D)\lambda. \quad (8)$$

From Equation (8), we see that the lateral focus position is a linear function of wavelength for any given diffraction order m. Equation (8) also shows that for a short pulse laser beam with a spectral bandwidth Δλ, the focus is also dispersed proportional to λ:

$$\Delta x = f(m/D)\Delta \lambda \quad (9)$$

$$= (f \cdot (m/D)\lambda) \times \Delta \lambda / \lambda$$

$$= x \Delta \lambda / \lambda$$

Equation (9) shows that the focus dispersion is equal to the product of the lateral focus position x and the fractional bandwidth of the laser pulse $\Delta\lambda/\lambda$. The focus dispersion $\Delta x$ can deteriorate the focus significantly if $\Delta x$ is not negligible compared to the laser focus spot size of the drilling system at zero order m=0, (without dispersion). This forms the basis for later analysis.

Once it is understood how the higher orders from diffractive optical element 105, in conjunction with a telecentric scan lens 115 in a short pulse laser system, cause spectral dispersions and negatively impact drilling of workpiece 135, then knowledge of the laser system and known equations relating diffraction angles, such as diffraction angles $\theta 1$ and $\theta 2$, central wavelength $\lambda o$ and change in bandwidth $\Delta\lambda$, diffractive optical element period D, and pattern size, provide sufficient information to calculate minimum pulse width that will still satisfy customer specifications for a finished laser drilled product.

Figure 4:
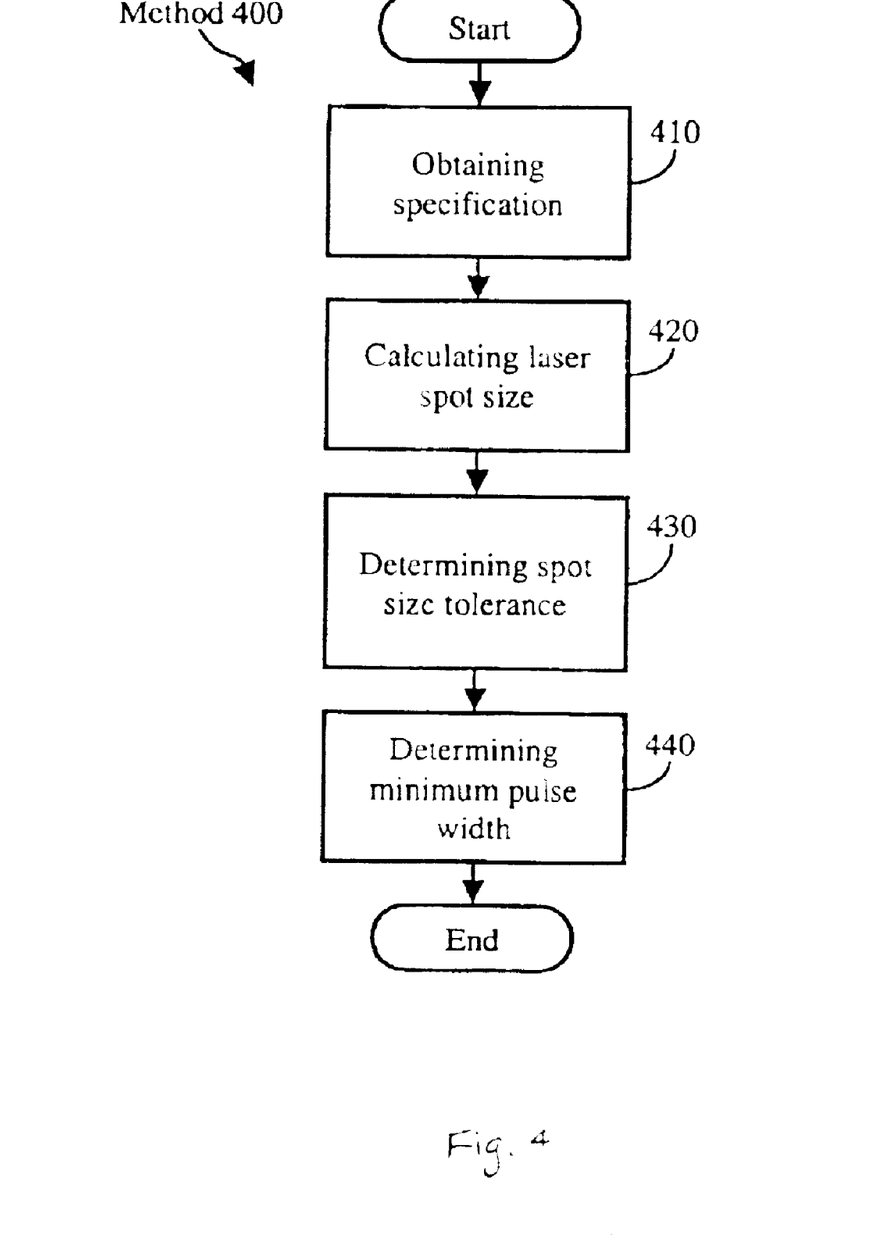
FIG. 4 is a flowchart depicting an exemplary method for determining a minimum pulse width for a pulse laser in accordance with the present invention.

In accordance with the present invention, FIG. 4 illustrates an exemplary method 400 of determining pulse width for a short pulse laser system. The method generally includes the steps of: obtaining specifications for the workpiece 410, determining laser spot size 420, determining spot size tolerance 430, and determining a minimum pulse width 440.

First, specifications are obtained at step 410 for the workpiece to be fabricated by laser parallel drilling. In this step, an operator, technician, or automated tool obtains physical specifications for the finished workpiece 135 regarding the pattern to be drilled. The specifications are normally given to the operator by the product designer. In the present invention, the important specifications are the hole size to be drilled, tolerances of the hole size variation, and the overall pattern size on the workpiece. In one example, the holes to be drilled have a diameter of 20 $\mu$m, with a tolerance specification of 20 $\mu$m+/−1 $\mu$m absolute and standard deviation of $\sigma$=0.5 $\mu$m, and the holes are to be drilled in parallel over a 15 mm transverse dimension.

Next, the laser spot size is calculated at step 420. In this step, an operator, technician, or automated tool determines laser spot size according to the workpiece specification and the specific optical paths and the optical elements affecting the path. This is usually done in combination of calculation and experimental determination. In one example, the diameter of the holes to be drilled is 20 $\mu$m. The laser spot size is first determined that it must be equal or smaller than 20 $\mu$m. Through experiments, a spot size diameter of d=10 microns is determined to be able to drill 20 $\mu$m holes using a trepanning algorithm.

The laser spot size tolerance is similarly determined at step 430. In this step, an operator, technician, or automated tool, combines the specifications obtained in step 410 with the laser spot size determined in step 420 to determine an acceptable tolerance or error in the spot size that can drill holes that meet the holes size tolerance. For fixed pulse energy and drilling algorithm, the hole size depends on the laser spot size. Using the parallel drilling system discussed in this present invention, the laser spot size varies across the workpiece pattern as determined in Step 410. Therefore the operator must determine the drilled hole size variation as a function of laser spot size variation. This is done through either calculation or experiment. In the example cited above, given a pattern size of 20 $\mu$m and a laser spot size of 10 $\mu$m, a tolerance of plus or minus 0.5 $\mu$m is determined to be acceptable, which means the laser spot size may vary between 9.5 and 10.5 $\mu$m.

Lastly, a minimum pulse width is determined at step 440. In this step, an operator, technician, or automated tool, determines a minimum pulse width for the laser drilling system that can achieve the specifications obtained in step 410. This step is based on equations (1)–(7) described above. Specifically, a single equation to determine minimum pulse width is derived as set forth below. For clarity, variables used in the following equations are defined as follows: $\lambda$=wavelength, $\nu$=frequency, c=speed of light, $3\times10^8$ meters/second, $\Delta\tau$=pulse width, $\lambda_o$=central operating wavelength, $\Delta\lambda$=bandwidth, $d_o$=spot size diameter, $\Delta d$=spot size tolerance, and $X_{max}$=pattern size (roughly the radius of pattern to be drilled).

The following analysis uses the assumption of equation (1) and its equivalent equation (3). This assumption depends upon the spectral purity of the pulse. Thus, it is assumed the temporal shape of the laser pulse is Gaussian. As will be apparent to one skilled in the art, the spectral purity of the laser pulse must be tested for a given laser system to ensure the calculations are accurate.

First, equation (3) is solved for pulse width $\Delta\tau$ as follows:

$$\Delta\tau = \frac{0.44 \times \lambda}{c}\left(\frac{\lambda}{\Delta\lambda}\right) \tag{10}$$

Once the relationship for $\Delta\tau$ has been determined, a separate equation is developed to relate spot size d, tolerance $\Delta d$ with bandwidth and central wavelength, taking into consideration of the dispersion of the diffractive optical element.

Referring to FIG. 1, a collimated incident beam 130 strikes diffractive optical element 105, one of the diffracted beam emerging from the diffractive optical element is focused by scan lens 115 onto the scan lens' focal plane at at lateral position x. If the incident beam 130 has a bandwidth $\Delta\lambda$=0, i.e., truly monochromatic, then the diffracted will have the minimum focus spot size determined by the optical beam delivery system in the absence of the spectral dispersion, in our example, $d_0$=10 $\mu$m. Conversely, if the bandwidth of incident beam 130 is not zero, then the effect on the focus spot of the diffractive optical element's dispersion must be considered. According to Equation (6), there is a lateral spread of focus position $\Delta x$ around x. Subsequently, the focus spot size becomes a convolution between the original spot size $d_0$ and the spread due to dispersion. In the case of a Gaussian spatial spot and a Gaussian spectral distribution as discussed in the above example, the convolved focus spot size is given by:

$$d = \sqrt{d_0^2 + \Delta x^2} \tag{11}$$

Substituting $\Delta x$ from equation (9) for maximum $\Delta x$, $$d_{max} = \sqrt{d_0^2 + (x_{max}\Delta\lambda/\lambda)^2} \tag{12}$$

This equation can be rearranged to solve for the ratio of bandwidth to central wavelength as follows:

$$\frac{\Delta\lambda}{\lambda_0} = \frac{1}{x_{max}}\sqrt{d_{max}^2 - d_0^2} \tag{13}$$

Lastly, inserting equation (13) into equation (10) provides a way to determine a minimum pulse width according to specification of the laser system and the pattern to be drilled.

As an example, suppose $d_0$=10 $\mu$m, the maximum allowable spot size is $d_{max}$=$d_0$+$\Delta d$=10+0.5=10.5 $\mu$m, and the pattern size is $x_{max}$=10 mm=$10^4$ $\mu$m. In addition, suppose that $\lambda_0$=1 $\mu$m=$10^{-4}$ cm, then we obtain $$\frac{\Delta\lambda}{\lambda_0} = \frac{1}{10^4}\sqrt{10.5^2 - 10^2} = 3.2 \times 10^{-4}$$

Equation (10) above then gives the minimum pulse width that can satisfy the above condition:

$$\Delta\tau = \frac{0.44 \times 10^{-4} \text{ cm}}{3 \times 10^{10} \text{ cm/s}}\left(\frac{1}{3.2 \times 10^{-4}}\right) = 4.6 \times 10^{-12} \text{ s} = 4.6 \text{ ps} \quad (13)$$

As shown by the pulse width equation (13) above, method 400 provides a way to determine a minimum pulse width that is within tolerances of pattern and shape specifications. Note that the preceding method may also be easily reconfigured to determine a maximum pattern size $X_{max}$ for a given laser system and pulse width.

Figure 5:
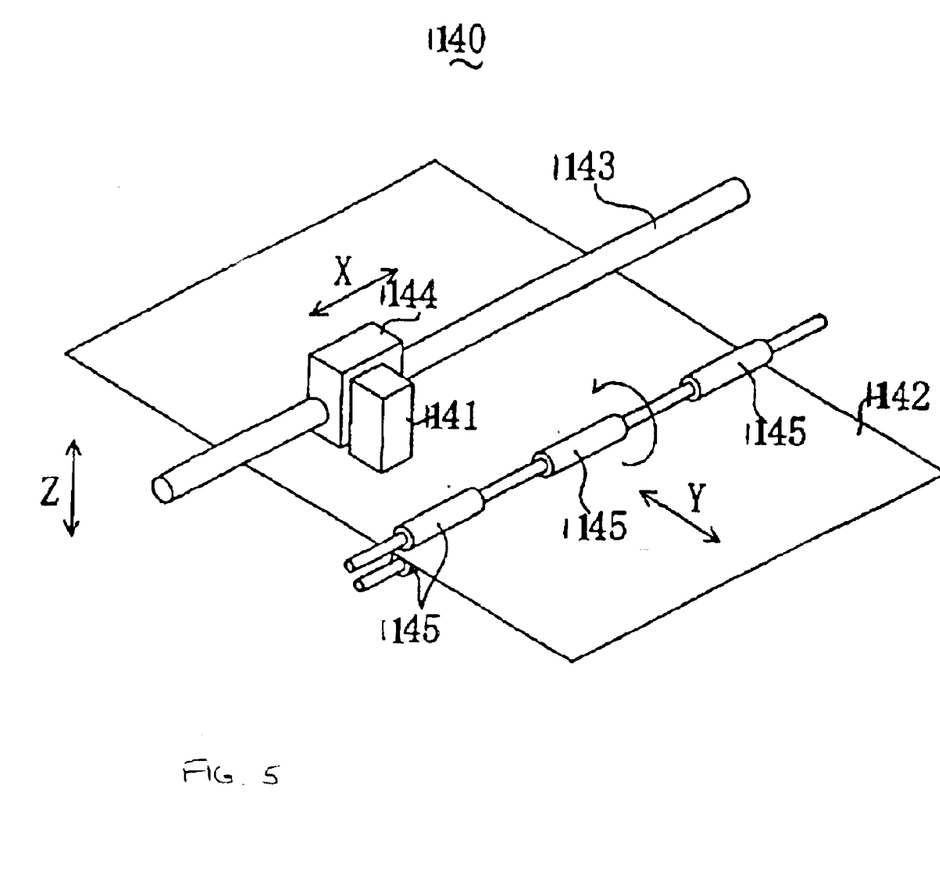
FIG. 5 is a perspective view illustrating the primary components of an ink-jet printer.

A laser drilling system of the present invention may be used to construct a nozzle plate of an ink-jet head as further described below. Referring to FIG. 5, an ink-jet printer 1140 includes an ink-jet head 1141 capable of recording on a recording medium 1142 via a pressure generator. The ink-jet head 1141 is mounted on a carriage 1144 capable of reciprocating movement along a carriage shaft 1143.

In operation, ink droplets emitted from the ink-jet head 1141 are deposited on the recording medium 1142, such as a sheet of copy paper. The ink-jet head 1141 is structured such that it can reciprocate in a primary scanning direction X in parallel with the carriage shaft 1143; whereas the recording medium 1142 is timely conveyed by rollers 1145 in a secondary scanning direction Y.

Figure 6:
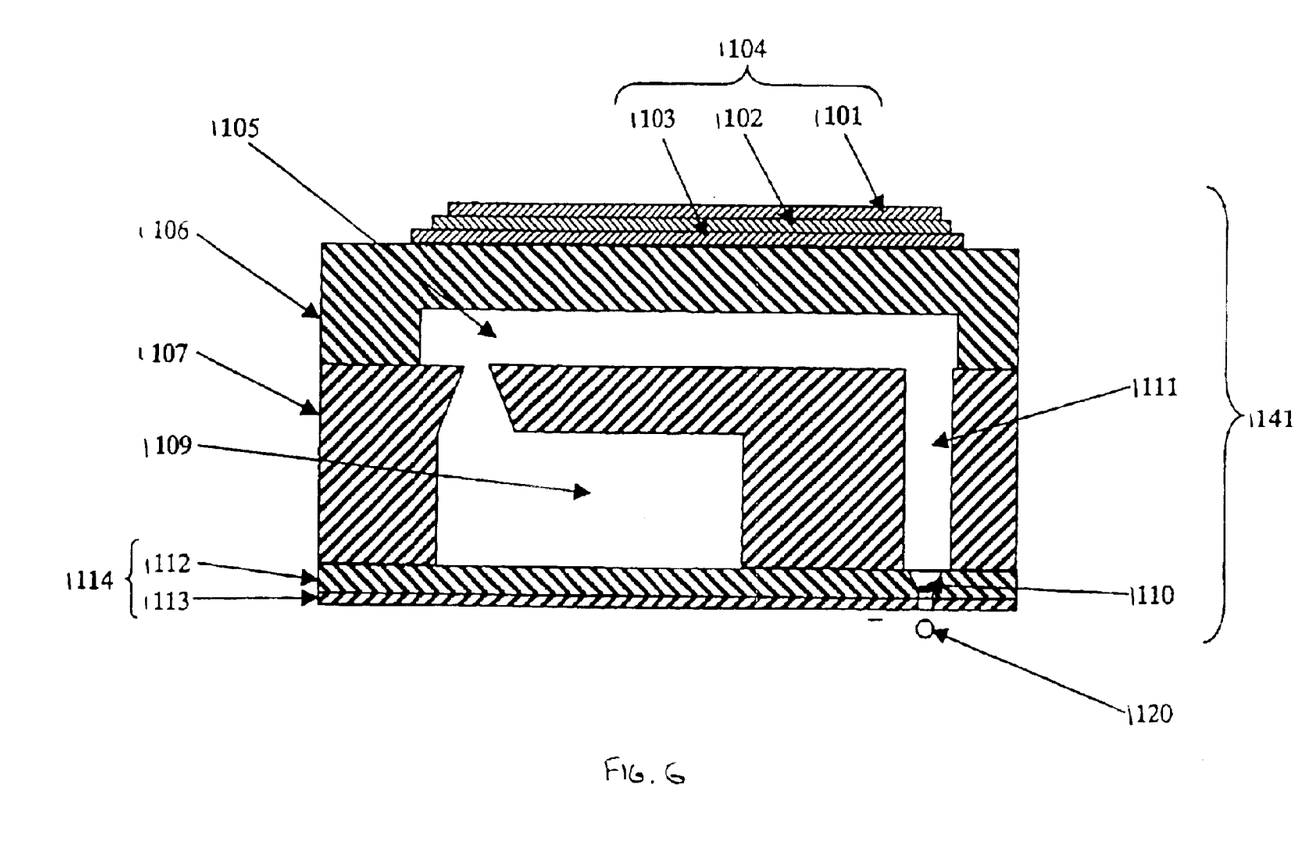
FIG. 6 is a cross-sectional schematic view of an exemplary ink-jet head.

FIG. 6 further illustrates the construction of an exemplary ink-jet head 1141. The ink-jet head is primarily comprised of a pressure generator 1104 and a nozzle plate 1114. In this embodiment, the pressure generator 1104 is a piezoelectric system having an upper electrode 1101, a piezoelectric element 1102, and a lower electrode 1103. Although a piezoelectric system is presently preferred, it is envisioned that other types of systems (e.g., a thermal-based system) may also be employed by the ink-jet head 1141.

The nozzle plate 1114 is further comprised of a nozzle substrate 1112 and a water repellent layer 1113. The nozzle substrate 1112 may be constructed from a metal or resin material; whereas the water repellant layer 1113 is made of fluororesin or silicone resin material. In this exemplary embodiment, the nozzle substrate 1112 is made of stainless steel having a thickness of 50 um and the water repellent layer 1113 is made of a fluororesin having a thickness of 0.1 um.

The ink-jet head 1141 further includes an ink supplying passage 1109, a pressure chamber 1105, and an ink passage 1111 disposed between the pressure generator 1104 and the nozzle plate 1114. In operation, ink droplets 1120 are ejected from the nozzle 110. The nozzle 1110 is preferably formed without flash and foreign matter (e.g., carbon, etc.) in the nozzle plate. In addition, the accuracy of the nozzle outlet diameter is 20 um±1.5 um.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for determining a minimum pulse width for a pulsed laser beam in a short pulse laser system, such that the minimum pulse width accounts for dispersion associated with the pulse laser beam passing through a diffractive optical element, comprising:

determining size data for an ablation to be formed in a surface of a workpiece;

determining an operating wavelength for a pulsed laser beam;

determining spot size data for the beam incident on the workpiece;

determining tolerance data for the spot size of the incident beam; and determining a minimum pulse width for the pulsed laser beam based on the size data for the ablation, the operating wavelength for the laser beam, the spot size data for the laser beam and the tolerance data for the spot size.

2. The method of claim 1 wherein the ablation is further defined as a circular hole, such that the size data for the ablation is a diameter for the circular hole.

3. The method of claim 1 wherein the step of determining a minimum pulse width further comprises deriving a first relationship between the spot size of the incident beam and the tolerance for the spot size which accounts for dispersion associated with the diffractive optical element and using the first relationship to determine the minimum pulse width for the pulsed laser beam.

4. The method of claim 1 wherein the step of determining a minimum pulse width further comprises computing the minimum pulse width in accordance with $$\Delta\tau = \frac{0.44\lambda}{c}\left(\frac{x_{max}}{\sqrt{d_{max}^2 - d_0^2}}\right)$$

where $\lambda$ is the operating wavelength, c is the speed of light, $x_{max}$ is size data for the ablation, $d_{max}$ is maximum allowable spot size data, and the $d_0$ is the spot size data.

5. The method of claim 1 further comprises:

generating a pulsed laser beam in accordance with the minimum pulse width;

passing the pulsed laser beam through a diffractive optical element, thereby separating the pulse laser beam into two or more pulsed laser beams; and directing the two or more pulsed laser beams onto the surface of the workpiece, thereby forming two or more ablations in the surface of the workpiece.

6. The method of claim 5 wherein the step of generating a pulsed laser beam further comprises using a picosecond laser source.

7. The method of claim 5 wherein the step of directing the two or more pulsed laser beams further comprises focusing the two or more laser beams onto the surface of the workpiece using an optic element, and scanning the two or more laser beams along the surface of the workpiece by movably adjusting the optic element, thereby forming a pattern ablations in the surface of the workpiece.

8. A method for drilling multiple holes using a laser drilling system, comprising:

determining a minimum pulse width for a pulse laser beam, such that the minimum pulse width accounts for dispersion associated with the pulse laser beam passing through a diffractive optical element;

generating a pulsed laser beam in accordance with the minimum pulse width;

passing the pulsed laser beam through the diffractive optical element, thereby separating the pulse laser beam into two or more laser beams;

directing the two or more laser beams onto a surface of a workpiece, thereby drilling multiple holes into the surface of the workpiece.

9. The method of claim 8 wherein the step of determining a minimum pulse width further comprises determining size data for a hole to be formed in the surface of the workpiece;

determining an operating wavelength for the pulsed laser beam;

determining spot size data for the beam incident on the workpiece;

determining tolerance data for the spot size of the incident beam; and determining a minimum pulse width for the pulsed laser beam based on the size data for the hole, the operating wavelength for the pulsed laser beam, the spot size data for the laser beam and the tolerance data for the spot size.

10. The method of claim 9 wherein the step of determining a minimum pulse width further comprises computing the minimum pulse width in accordance with $$\Delta \tau = \frac{0.44 \lambda}{c} \left( \frac{x_{max}}{\sqrt{d_{max}^2 - d_0^2}} \right)$$

where $\lambda$ is the operating wavelength, c is the speed of light, $x_{max}$ is size data for the ablation, $d_{max}$ is maximum allowable spot size data, and the $d_0$ is the spot size data.

11. The method of claim 8 wherein the step of generating a pulsed laser beam further comprises using a picosecond laser source.

12. The method of claim 8 wherein the step of directing the two or more laser beams further comprises focusing the two or more laser beams onto the surface of the workpiece using a telecentric lens, and scanning the two or more laser beams along the surface of the workpiece by movably adjusting the telecentric lens, thereby drilling a pattern of holes into the surface of the workpiece.

13. The method of claim 1 wherein the workpiece is further defined as a nozzle plate for an ink-jet head.

14. The method of claim 8 wherein the workpiece is further defined as a nozzle plate for an ink-jet head.

\* \* \* \* \*